United States Patent
Meyer et al.

(10) Patent No.: US 6,440,592 B1
(45) Date of Patent: Aug. 27, 2002

(54) THERMOCHROMIC COATING

(75) Inventors: Bruno K. Meyer, Wetzlar-Münchholzhausen; Dirk Schalch, Giessen; Thomas Christmann, Heusweiler, all of (DE)

(73) Assignee: Bruno K. Meyer, Wetzler-Munchholzhausen (DE)

( * ) Notice: Subject to any disclaimer, the term of this patent is extended or adjusted under 35 U.S.C. 154(b) by 0 days.

(21) Appl. No.: 09/701,635

(22) PCT Filed: Jun. 2, 1999

(86) PCT No.: PCT/EP99/03843
§ 371 (c)(1),
(2), (4) Date: Feb. 1, 2001

(87) PCT Pub. No.: WO99/62836
PCT Pub. Date: Dec. 9, 1999

(30) Foreign Application Priority Data

| Jun. 3, 1998 | (DE) | 198 24 800 |
| Dec. 9, 1998 | (DE) | 198 56 821 |
| Dec. 23, 1998 | (DE) | 198 60 026 |

(51) Int. Cl.$^7$ .............. B32B 19/00; B32B 15/04; B05D 1/36; C23C 14/34

(52) U.S. Cl. ............ 428/701; 427/419.2; 427/419.3; 427/419.7; 204/192.22; 204/192.23; 428/472; 428/699

(58) Field of Search ............ 204/192.15, 192.22, 204/192.23; 428/426, 428, 446, 472, 699, 701; 427/419.2, 419.3, 419.7

(56) References Cited

U.S. PATENT DOCUMENTS

| 3,899,407 A | 8/1975 | Eastwood et al. ........ 204/192 |
| 4,401,690 A | 8/1983 | Greenberg ................ 427/87 |

FOREIGN PATENT DOCUMENTS

DE 33 03 154 8/1989 ......... C03C/17/245

OTHER PUBLICATIONS

Khan et al., "Thermochromic Sputter–Deposited Vanadium Oxyfluoride Coatings With Low Luminous Absorptance", Appl. Phys. Lett 55 (1), Jul. 3, 1989.
Khan et al., "Optical Properties at the Metal–Insulator Transition in Thermochromic $VO_{2-x}F_x$ Thin Films", J. Appl. Phys. 64 (6), Sep. 15, 1988.
Granqvist, C.G., "Window Coatings for the Future", Thin Solid Films, 193/194, 1990, S. 730–741.
Chemical Abstracts, vol. 123, 1995, Ref. 100978b.
Chemical Abstracts, vol. 110, 1989, Ref. 236008z.
Chemical Abstracts, vol. 123, 1995, Ref. 212468s.
Chemical Abstracts, vol. 123, 1995, Ref. 206325b.
Chemical Abstracts, vol. 122, 1995, Ref. 117634p.
Chemical Abstracts, vol. 121, 1994, Ref. 41115b.
Chemical Abstracts, vol. 106, 1987, Ref. 181283v.
JP 07331430 A., Patent Abstracts of Japan, "Production of Thermochromic Material", Taira et al. Dec. 19, 1995.
English Translation of German Search Report.
Database Inspec Online! Institute of Electrical Engineers, Stevenage, GB Ping Jin et al.: "Thermochromic films of V/sub 1–x/M/sub x/0/sub 2/for optical switchable glazing deposited by reactive magnetron sputtering" Database accession No. 5114911 Zusammenfassung & Reports of the National Industrial Research Institute of Nagoya, (Jul. 8, 1995) Japan, Bd. 44, Nr. 7–8, Seiten 367–381, ISSN: 1340–3729.

(List continued on next page.)

Primary Examiner—Steven H. Versteeg
(74) Attorney, Agent, or Firm—Nixon & vanderhye P.C.

(57) ABSTRACT

A thermochromic coating comprises a vanadium oxide layer 16 which comprises tungsten and fluorine (FIG. 1).

25 Claims, 3 Drawing Sheets

OTHER PUBLICATIONS

Database Inspec Online! Institute of Electrical Engineers, Stevenage, GB Tazawa M et al.: "Optical contants of $V_{1-x}W_xO_2$ thermochromic films and their application to the selective radiating material" Database accession No. 5227480 Zusammenfassung & Optical Materials Technology for Energy Efficiency and Solar Energy Conversion XIV, San Diego, CA, USA, (Jul. 1995) Bd. 2531, Seiten 326–332, Proceedings of the SPIE–The International Society for Optical Engineering, 1995, SPIE–Int. Soc. Opt. Eng, USA.

Chemical Abstracts, vol. 126, No. 11 (Mar. 1997) Columbus, Ohio, US; abstract No. 146250, Tazawa et al.: "New selective rediating materials combined with V02 type thermochromic films" Zusammenfassung & Taiyo Enerugi (1996), 22(6), 51–57.

Chemical Abstracts, vol. 124, No. 10, (Mar. 1996) Columbus, Ohio, US: abstract No. 131358, Lee, Sl–Woo et al.: "A study on the thermochromism of $V_{1-x}M_xO_2$ thin film" Zusammenfassung & Han'Guk Chaelyo Hakhoechi (1994), 4(6), 715–22.

Chemical Abstracts, vol. 123, No. 24, (Dec. 1995) Columbus, Ohio, US: abstract No. 318728, Tazawa et al.: "Optical constants of $V_{1-x}W_xO_2$ thermochromic films and their application to the selective radiating material" Zusammenfassung & Proc. SPIE–Int. Soc. Opt. Eng. (1995), 2531 (Optical Materials Technology for Energy Efficiency and Solar Enregy Conversion XIV) 326–32.

Chemical Abstracts, vol. 123, No. 16, (Oct. 1995) Columbus, Ohio, US: abstract No. 212468, Jin, Ping et al.: "Thermochromic films of $V_{1-x}M_xO_2$ for optical switchable glazing deposited by reactive magnetron sputtering" Zusammenfassung & Nagoya Kogyo Gijutsu Kenkyusho Hokoku (1995), 44(7/8), 367–81.

Chemical Abstracts, vol. 104, No. 16, (Apr. 1986) Columbus, Ohio, US: abstract No. 132866, Jorgenson, G. V. et al.: "Thermochromic materials research for optical switching films" Zusammenfassung & Proc. SPIE–Int. Soc. Opt. Eng. (1985), 562(Opt. Mater, Technol. Energy Effic. Sol. Energy Convers. 4), 2–5.

THERMOCHROMIC COATING

The present invention relates to a thermochromic coating and a process for the production thereof. Coatings of this type are intended for use in building construction for glass windows or glass cladding in order to be able to influence the room climate in the interior of the building by utilizing the transmission factor of these coatings, which changes with temperature.

A coating material which has proven advantageous for the coating of architectural glass is vanadium oxide. It is known that crystalline vanadium oxide has a switching temperature $T_s$ in the region of 68° C. I.e. a semiconductor-metal phase transition occurs at this temperature, so that the transmission factor, in particular in the infrared region, i.e. in the wave-length range of 1000 nm and above, is significantly lower at temperatures above this switching temperature $T_s$ owing to the metallic state which then exists, than at a temperature below the switching temperature $T_s$, at which the vanadium oxide, i.e. vanadium dioxide, is in the semiconductor state.

In the past, various attempts have been made to shift this switching temperature in the region of 68° C. into the region of room temperature. It has been found that doping of the vanadium oxide with tungsten results in a shift in the switching temperature into the region of room temperature, where the tungsten content here should be in the region of 2.6%. However, it has furthermore been found that the incorporation of tungsten can result in a slight reduction in the transmission factor in the visible region.

It is furthermore known to dope vanadium dioxide layers with fluorine, where, in the case of fluorine doping, the problem exists that on deposition of these layers by reactive high-frequency or radiofrequency sputtering, incorporation of fluorine into the vanadium oxide lattice is only obtained at deposition temperatures of below 600° C. However, such low deposition temperatures have an effect on the crystal structure of the vanadium oxide lattice, with the result that a transition from the polycrystalline to the amorphous state can occur with falling deposition temperature. The consequence of this increasing disorder in the lattice is an impaired switching property of the layers obtained in this way.

It is an object of the present invention to provide a thermochromic coating, in particular for glass, which, while having good switching properties, has a switching temperature in the region of room temperature and a transmission behavior in the visible spectral region which is improved compared with known layers. It is a further object of the present invention to provide a process for the production of layers of this type.

The first-mentioned aspect of the object is achieved in accordance with the present invention by a thermochromic coating, in particular for glass, which comprises a vanadium oxide layer which furthermore comprises tungsten and fluorine.

It has been found that co-doping of the vanadium oxide lattice with tungsten and fluorine gives rise to a synergistic effect which was not to be expected from the two above-outlined individual behaviors of tungsten-doped coatings on the one hand and fluorine-doped coatings on the other hand. Co-doping or vanadium oxide with tungsten and fluorine firstly has the consequence that, owing to the incorporation of tungsten, the switching temperature $T_s$ is lowered into the region of room temperature. Furthermore, the simultaneous incorporation of fluorine has the consequence that the transmission factor of the coatings produced in this way in the visible and ultraviolet spectral region, i.e. in particular in the wavelength range of 500 nm or less, is improved. The consequence of this is that the outer appearance can be significantly improved owing to the improved color neutrality compared with known thermochromic coatings, for example vanadium oxide layers doped merely with tungsten, through the increase in the transmission factor in the wavelength range mentioned. These known coatings generally have a color effect shimmering yellow and green.

The tungsten content in the thermochromic coatings according to the present invention can be in the range 2.6 atom-%.

In a corresponding manner, the fluorine content can be in the range from 0.01 to 2 atom-%, preferably from 0.5 to 1.5 atom-%.

In order to be able to avoid the above-mentioned problem of the increasing disorder in the lattice on reduction of the room temperature, which is necessary for the incorporation of fluorine, on deposition of the layers according to the invention, it is furthermore proposed that an intermediate layer be provided between the vanadium oxide layer and a substrate carrying this vanadium oxide layer, where the intermediate layer comprises a titanium oxide layer. It has been found that, if the vanadium oxide layer to be doped with fluorine and tungsten is deposited on this titanium oxide layer, the stresses present in the vanadium oxide lattice can be reduced and the growth conditions for the vanadium oxide layer at low deposition temperatures, for example in the region of 300° C., can be improved, so that the reduction of the deposition temperature to the stated range does not result in a corresponding impairment of the optical properties. The invention furthermore relates to a thermochromic coating, in particular for glass, comprising a vanadium oxide layer which comprises tungsen, preferably in the range from 1.0 to 2.6 atom-%, most preferably in the range from 1.6 to 2 atom-%, and where the coating furthermore comprises an intermediate layer of titanium oxide which is or can be arranged between the vanadium oxide layer and a substrate carrying the vanadium oxide layer. It has been found that the provision of the titanium oxide intermediate layer may also be advantageous in the case of the use of vanadium oxide doped merely with tungsten, in particular if, for example, the deposition temperature is lowered in order to influence the tungsten content in the thermochromic layer. Owing to the titanium oxide layer, the deposition conditions for the tungsten-doped vanadium oxide layer are improved, as mentioned above, so that the optical properties of thermochromic coatings of this type are improved in a corresponding manner.

The invention furthermore relates to a thermochromic coating, in particular for glass, comprising a vanadium oxide layer which comprises fluorine, preferably in the range from 0.01 to 3 atom-%, most preferably in the range from 0.5 to 2.5 atom-%, and where the coating furthermore comprises an intermediate layer of titanium oxide which is or can be arranged between the vanadium oxide layer and a substrate carrying the vanadium oxide layer. The above-described advantageous effect of a titanium oxide intermediate layer can also result in considerable improvements in the optical properties in the case of a vanadium oxide layer doped merely with fluorine.

In order to prevent post-oxidation of the vanadium oxide layer—doped with tungsten or tungsten and fluorine—it is proposed that a silicon oxynitride cover layer furthermore be provided on the vanadium oxide layer. This silicon oxynitride layer results not only in the prevention of post-oxidation, but also forms, in particular, an antireflection layer, through which the transmission, in particular in the visible spectral region, can additionally be improved.

It has proven advantageous or the cover layer to have a thickness in the range from 10 to 300 nm, preferably from 10 to 100 nm.

The vanadium oxide layer can have a thickness in the range from 30 to 350 nm, preferably from 50 to 150 nm.

The intermediate layer mentioned can have, for example, a thickness in the range from 10 to 100 nm, preferably from 30 to 70 nm.

The second-mentioned aspect of the object indicated above is achieved in accordance with the present invention by a process for the production of a thermochromic coating, in particular for glass, which comprises a) the deposition of a vanadium oxide layer doped with tungsten and fluorine.

The deposition of the vanadium oxide layer can be carried out by a sputtering process, preferably high-frequency sputtering or magnetron sputtering.

This vanadium oxide layer doped with tungsten and fluorine can be deposited, for example, by reactive high-frequency or radiofrequency sputtering of a tungsten-containing vanadium target in an atmosphere comprising an oxygen/argon mixture and trifluoromethane ($CHF_3$).

The trifluoromethane partial pressure here is preferably in the range $0.5$–$5 \cdot 10^{-3}$ Pa.

Furthermore, the deposition power is preferably in the range 200–600 W and the deposition temperature is preferably in the range 200–600° C., most preferably about 300° C. This is a temperature range in which the incorporation of fluorine into the vanadium oxide lattice is also achieved.

In order to prevent an amorphous vanadium oxide phase mixture, which does not exhibit a metal-semiconductor phase transition in the range below 100° C., from being generated during the deposition, a titanium oxide layer is preferably deposited on the substrate before step a). As already mentioned, this titanium oxide layer has the consequence that the stresses generated in the vanadium oxide lattice are reduced and improved growth conditions are created for the vanadium oxide layer, in particular at deposition temperatures in the region of 300° C.

The titanium oxide layer can also be deposited by a sputtering process, preferably magnetron sputtering or reactive high-frequency or radiofrequency sputtering, of a titanium target in an atmosphere comprising an oxygen/argon mixture.

When carrying out reactive high-frequency sputtering, the deposition power during deposition of the titanium oxide layer is preferably in the range from 200 to 600 W and a deposition temperature during the deposition of the titanium oxide layer is preferably in the range from room temperature to 600° C.

In order to prevent post-oxidation of the deposited vanadium oxide layer and impairment of the optical properties induced thereby, it is proposed that a silicon oxynitride layer be deposited on the vanadium oxide layer after step a). As already mentioned, this silicon oxynitride layer furthermore has a consequence of the advantageous effect that it acts as an anti-reflection layer, and the transmissivity of the coating according to the invention, in particular in the visible spectral region, is thereby significantly improved.

The silicon oxynitride layer can be deposited, for example, by a sputtering process, preferably magnetron sputtering or reactive high-frequency or radiofrequency sputtering, of a silicon target in an atmosphere comprising an argon/oxygen/nitrogen mixture.

When carrying out reactive high-frequency sputtering here, the deposition power is preferably in the range from 200 to 300 W and the deposition temperature during deposition of the silicon oxynitride layer is preferably in the range from room temperature to 200° C.

The present invention furthermore relates to a process for the production of a thermochromic coating, in particular for glass, comprising:

a) deposition of a titanium oxide layer on a substrate, preferably a glass substrate, and b) deposition of a vanadium oxide layer, preferably doped with tungsten or fluorine, onto the titanium oxide layer.

The invention is described in detail below on the basis of preferred embodiments and with reference to the attached drawings, in which.

Figure 1:
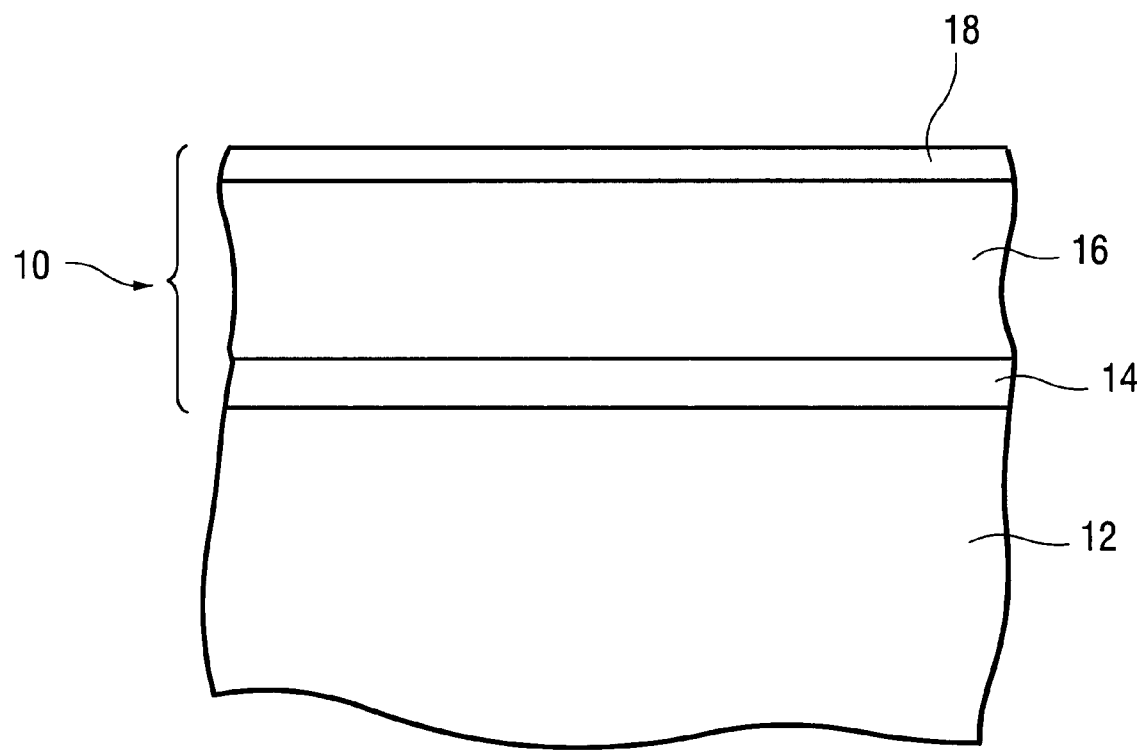
FIG. 1 shows the basic structure of a thermochromic coating according to the invention for a window glass.

FIG. 1 shows the basic structure of an example of a coating 10 according to the invention, as can be applied, for example, to a window glass pane 12. The first layer of the coating 10, applied directly to the glass pane 12, is a titanium oxide layer 14, which can be produced by reactive high-frequency sputtering under the following deposition conditions:

| | | |
|---|---|---|
| 1. | Sputtering target: | titanium |
| 2. | Process gas: | oxygen/argon mixture having a ratio in the region of 0.16, for example, |
| 3. | Process pressure: | $10^{-1}$ Pa, |
| 4. | Deposition power: | 300 W |
| 5. | Deposition temperature: | room temperature to 600° C. |

In this way, a $TiO_2$ layer is formed which is an intermediate layer between the glass substrate 12 and the doped vanadium oxide layer 16 to be deposited subsequently. Since the vanadium oxide layer 16 is to be doped both with tungsten and with fluorine, the deposition temperature for this must be lowered to below 600° C. so that, on omission of the titanium oxide intermediate layer, an amorphous vanadium oxide mixture which does not have the desired optical properties would be produced. The $TiO_2$ intermediate layer provides improved growth conditions for the vanadium oxide layer, in particular at the lower deposition temperatures.

The deposition conditions for layer 16, which is likewise produced by reactive high-frequency sputtering and which forms the actual thermochromic layer, are as follows:

| | | |
|---|---|---|
| 1. | Sputtering target: | vanadium with, for example, rod-like tungsten inserts, |
| 2. | Process gas: | oxygen/argon mixture (ratio 0.16) + $CHF_3$ |
| 3. | Process pressure: | $10^{-1}$ Pa, |
| 4. | $CHF_3$ partial pressure: | $0.5$–$5 \cdot 10^{-3}$ Pa, |
| 5. | Deposition power: | 200–600 W, |
| 6. | Deposition temperature: | 200–600° C. |

Under these deposition conditions, the targeted incorporation of fluorine and tungsten into the vanadium oxide lattice can be obtained, so that ultimately a thermochromic layer which can be described by the formula $V_{1-X} W_X O_{2-Y} F_Y$ is obtained.

As described below with reference to FIGS. 2 and 3, the joint incorporation of fluorine and tungsten results firstly in a lowering of the phase transition temperature, i.e. the switching temperature $T_s$, and secondly in a shift in the absorption edge further into the blue spectral region.

Furthermore, a silicon oxynitride covering layer 18 is provided on the actual thermochromic layer 16. This silicon oxynitride covering layer is likewise produced by reactive high-frequency sputtering with the following deposition parameters:

| 1. | Sputtering target: | silicon |
|---|---|---|
| 2. | Process gas: | argon/oxygen/nitrogen mixture |
| 3. | Process pressure: | $10^{-1}$ Pa, |
| 4. | Deposition power: | 200–300 W, |
| 5. | Deposition temperature: | room temperature to 200° C. |

A covering layer which can be described by the formula $SiO_X N_Y$ is thus generated which firstly prevents post-oxidation of the thermochromic vanadium oxide layer 16 and secondly serves as antireflection layer, by means of which the transmission, in particular in the visible spectral region, can be increased. Silicon oxynitride layers having a refractive index in the region of 1.65, for example, have proven advantageous here.

During the deposition of the silicon oxynitride layer 18, the proportions of the various process gases oxygen/argon/nitrogen (n % by volume) should be set as follows: from 0/50/50 to 50/50/0. By varying the various values, i: as possible to adjust, in particular, the antireflection property, i.e. the refractive index of this covering layer 13.

Figure 2:
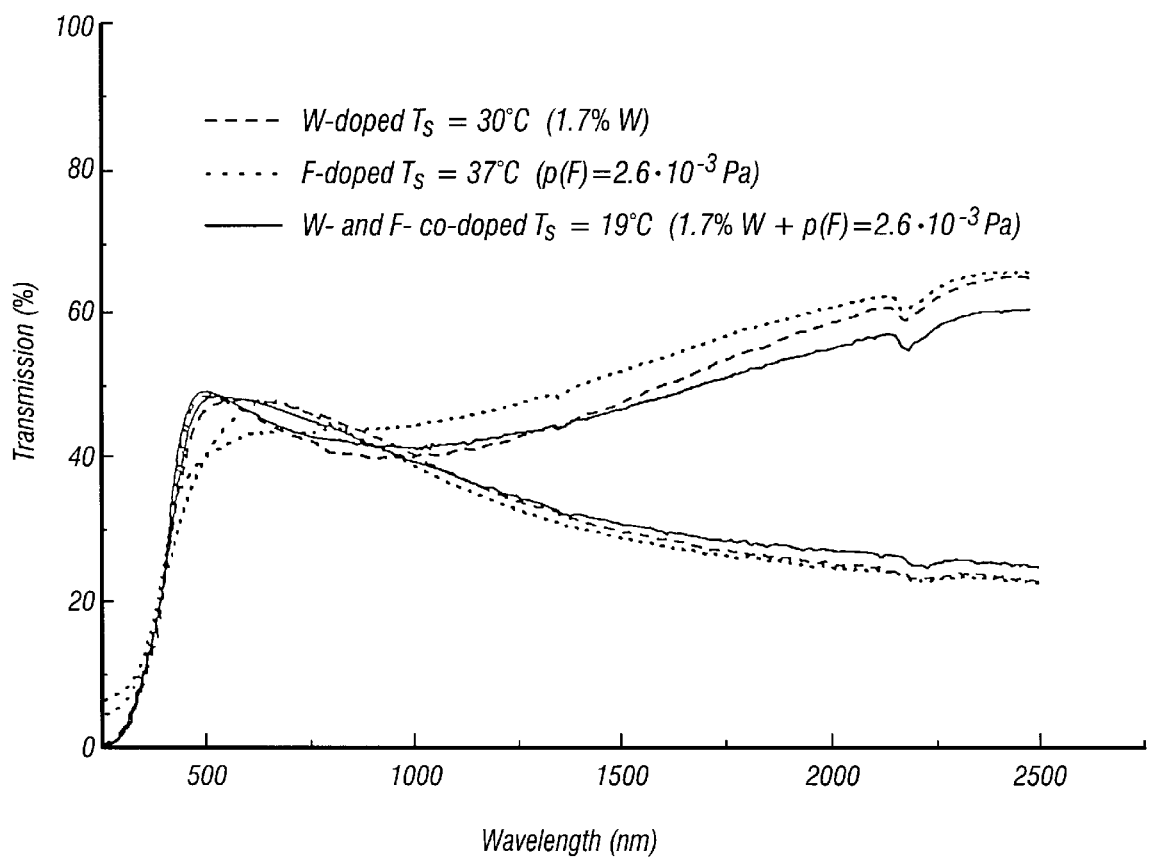
FIG. 2 shows the wavelength-dependent transmission of various thermochromic coatings based on vanadium oxide.

FIG. 2 shows the transmission behavior as a function of the wavelength for various doped vanadium oxide layers, where layers without an additional covering layer 18 were used here. In particular, the comparison between a layer doped merely with tungsten, a layer doped merely with fluorine and a layer doped with fluorine and tungsten is shown. The three different layers were deposited with the following deposition parameters:

Tungsten-doped Layer

| 1. | Sputtering target: | vanadium with tungsten inserts |
|---|---|---|
| 2. | Process gas: | oxygen/argon mixture in a ratio of 0.15 |
| 3. | Process pressure: | $10^{-1}$ Pa |
| 4. | Deposition power: | 300 W |
| 5. | Deposition temperature: | 500° C. |

A tungsten content of 1.75 atom-% was obtained here.
Fluorine-doped Layer

| 1. | Sputtering target: | vanadium |
|---|---|---|
| 2. | Process gas: | argon/oxygen mixture having a ratio of 0.11 and $CHF_3$ |
| 3. | Process pressure: | $10^{-1}$ Pa |
| 4. | $CHF_3$ partial pressure: | $2.6 \cdot 10^{-3}$ Pa |
| 5. | Deposition power: | 300 W |
| 5. | Deposition temperature: | 300° C. |

A fluorine content of 0.7 atom-% was obtained here.
W- and F-doped Layer

| 1. | Sputtering target: | vanadium with tungsten inserts |
|---|---|---|
| 2. | Process gas: | oxygen/argon mixture having a ratio of 0.11 and $CHF_3$ |
| 3. | Process pressure: | $10^{-1}$ Pa |
| 4. | $CHF_3$ partial pressure: | $2.6 \cdot 10^{-3}$ Pa |
| 5. | Deposition power: | 300 W |
| 6. | Deposition temperature: | 300° C. |

A tungsten content of 1.75 atom-% and a fluorine content of 0.7 atom-% were established here.

By comparing the three curves, it can be seen that the vanadium oxide layer doped with tungsten and fluorine, compared both with the tungsten-doped layer and with the fluorine-doped layer, has increased transmission values in the region of small wavelengths with a switching temperature $T_s$, in the region of 19° C. In particular, this tungsten- and fluorine-doped layer has a lowered switching wavelength compared with the layer doped merely with fluorine, i.e. the transmission difference when exceeding or falling below the switching temperature starts even at wavelengths in the region of 800 nm, compared with about 1000 nm in the case of the fluorine-doped layer.

Figure 3:
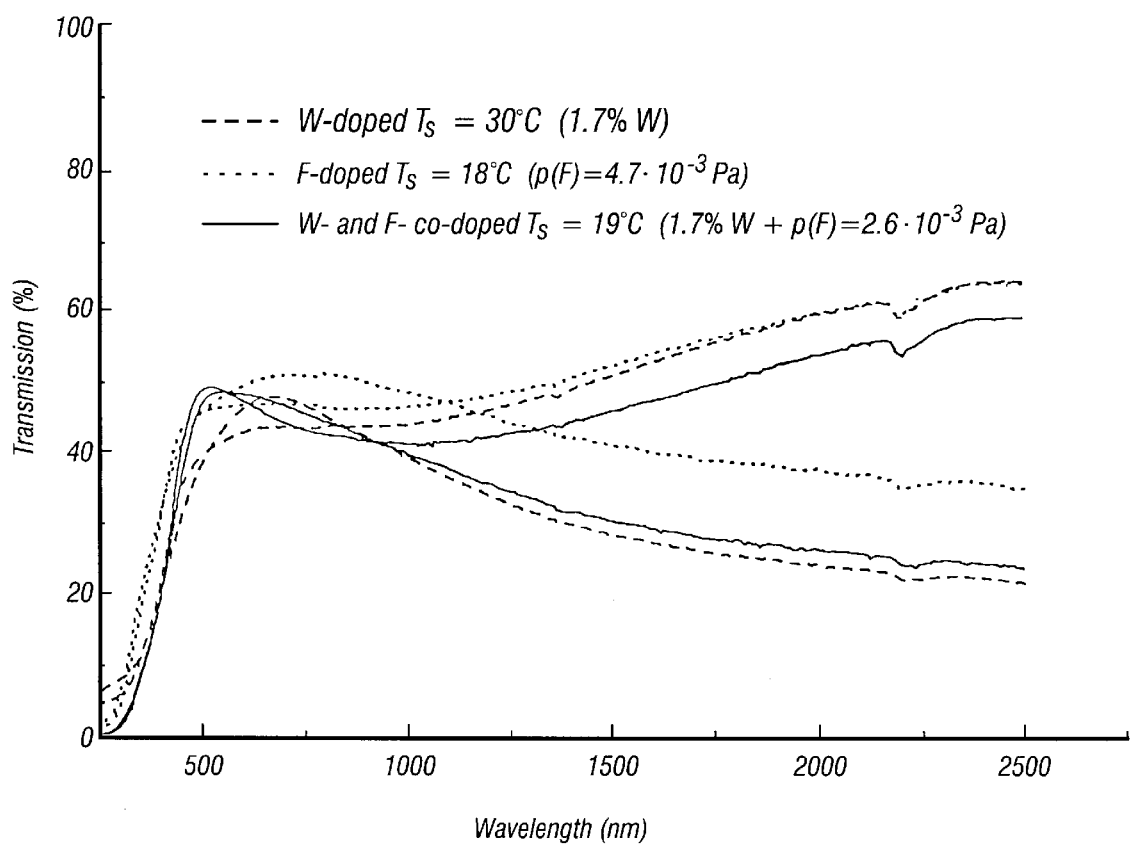
FIG. 3 shows a diagram corresponding to FIG. 1 with a different fluorine content.

FIG. 3 shows the comparison of the curves shown in FIG. 2 for the layer doped with tungsten and the layer doped with tungsten and fluorine with another layer doped only with fluorine, which, owing to the greater fluorine content, has a further reduced switching temperature, but has a transmission factor, in particular in the region of small wavelengths, i.e. at about 500 nm or less, which is lowered compared with the curve shown in FIG. 2 for the sample doped only with fluorine.

The deposition conditions for the layer doped only with fluorine, which is shown graphically in FIG. 3, were as follows:

| 1. | Sputtering target: | vanadium |
|---|---|---|
| 2. | Process gas: | oxygen/argon mixture having a ratio of 0.09 and $CHF_3$ |
| 3. | Process pressure: | $10^{-1}$ Pa |
| 4. | $CHF_3$ partial pressure: | $4.7 \cdot 10^{-3}$ Pa |
| 5. | Sputtering power: | 300 W |
| 6. | Sputtering temperature: | 300° C. |

A fluorine content of 1.2 atom-% was established here.

The comparison of FIGS. 2 and 3 shows that the synergistic effect obtained by co-doping of the vanadium oxide layer with tungsten and fluorine could not have been expected since the increasing incorporation of fluorine into the vanadium oxide actually gave rise to expectations of the opposite effect, namely a reduction in the transmissivity in this region.

It should be pointed out that the tungsten content of the thermochromic layer 16 can be controlled by changing the proportion by volume of tungsten in the sputtering target. The fluorine proportion can be controlled by adjusting the $CHF_3$ partial pressure in the process gas.

Raising the transmission factor in the visible spectral region and in the blue region has the consequence that the optical appearance of the thermochromic coating according to the invention (with and without an antireflection layer) can be improved compared with the layers known from the prior art which are doped merely with tungsten or merely with fluorine, it nevertheless being possible to make use of the lowering of the switching temperature into the region or room temperature through the incorporation or tungsten. As can be seen in FIG. 2 and 3, the wavelength range from which, on occurrence of the switching behavior, a transmission difference between the metallic phase and the semiconducting phase occurs, increases owing to the incorporation of fluorine compared with the material doped purely with tungsten. However, this wavelength range is nevertheless still significantly below 1000 nm.

It should be pointed out that an improvement in the transmission behavior can be achieved merely by the provision of a titanium oxide intermediate layer between the glass substrate and the vanadium oxide layer, in particular even if the layers are doped only with tungsten or fluorine. The reason for this is again the above-mentioned improvement in the growth conditions for the vanadium oxide layer and the consequent improvement in the crystal structure. This means that merely the arrangement of a titanium oxide intermediate layer beneath the vanadium oxide layer results in such improved growth conditions, and consequently improved crystallographic structures in the vanadium oxide layer, that its optical properties can be significantly improved, irrespective of whether there is no doping or whether doping is carried out with tungsten and/or fluorine. It should be pointed out that doping or the vanadium oxide exclusively with fluorine can be obtained, for example, by using a sputtering target consisting merely of a vanadium core without tungsten inserts. An undoped vanadium oxide layer can furthermore be obtained by additionally preventing the incorporation of fluorine by omitting the fluorine-containing process gas. The deposition conditions for such layers, i.e. the temperature and the power, can then be selected as indicated in the above-mentioned examples.

It should furthermore be pointed out that, although the production of the coating according to the invention by a high-frequency sputtering process has been described above, other sputtering processes, such as, for example, magnetron sputtering, can also be employed. Here too, parameter values or value ranges as indicated, for example, above, can again be used for the respective deposition conditions. However, the advantage of production of the coating by magnetron sputtering is that the deposition power can be reduced compared with high-frequency sputtering, which results in the considerable advantage of reduced production costs, in particular on use on a large industrial scale.

It should also be pointed out that the term vanadium oxide as used in the present text is generally taken to mean a vanadium dioxide lattice ($VO_2$) in which, for example in the case of doping with fluorine, oxygen is replaced by fluorine in some positions. In a corresponding- manner, vanadium is replaced by tungsten in some positions in the case of tungsten doping. However, the generally polycrystalline lattice structure of vanadium dioxide is retained.

What is claimed is:

1. A thermochromic coating on glass, the coating comprising a vanadium oxide layer which furthermore comprises tungsten and fluorine.

2. A coating as claimed in claim 1, characterized in that the tungsten content is in the range from 0.01 to 3.0 atom-%.

3. A coating as claimed in claim 1, characterized in that the fluorine content is in the range from 0.01 to 2 atom-%.

4. A coating as claimed in claim 1, characterized by an intermediate layer provided between the glass carrying the vanadium oxide layer and the vanadium oxide layer, wherein the intermediate layer comprises titanium oxide.

5. A coating as claimed in claim 4, characterized in that the intermediate layer has a thickness in the range from 10 to 100 nm.

6. A coating as claimed in claim 1, further comprising a silicon oxynitride covering layer on the vanadium oxide layer.

7. A coating as claimed in claim 6, characterized in that the covering layer has a thickness in the range from 10 to 300 nm.

8. A coating as claimed in claim 1, characterized in that the vanadium oxide layer has a thickness in the range from 30 to 350 nm.

9. A thermochromic coating on glass, comprising a vanadium oxide layer which comprises tungsten in the range from 1.0 to 2.6 atom-%, and furthermore comprising an intermediate layer of titanium oxide which is arranged between the vanadium oxide layer and a glass substrate carrying the vanadium oxide layer.

10. A thermochromic coating on glass, comprising a vanadium oxide layer which comprises fluorine, preferably in the range from 0.01 to 3 atom-%, and furthermore comprising an intermediate layer of titanium oxide which is arranged between the vanadium oxide layer and a glass substrate carrying the vanadium oxide layer.

11. A process for the production of a thermochromic coating on glass, comprising a) deposition on glass of a vanadium oxide layer doped with tungsten and fluorine.

12. A process as claimed in claim 11, characterized in that the deposition of the vanadium oxide layer is carried out by a sputtering process.

13. A process as claimed in claim 11, characterized in that the doped vanadium oxide layer is deposited by reactive high-frequency sputtering of a tungsten-containing vanadium target in an atmosphere comprising an oxygen/argon mixture and trifluoromethane.

14. A process as claimed in claim 13, characterized in that the trifluoromethane partial pressure is in the range $0.5$–$5 \cdot 10^{-3}$ Pa.

15. A process as claimed in claim 13, characterized in that the deposition power during deposition of the vanadium oxide layer is in the range 200–600 W.

16. A process as claimed in claim 13, characterized in that the deposition temperature during deposition of the vanadium oxide layer is in the range 200–600° C.

17. A process as claimed in claim 11, furthermore comprising, before step a), the deposition of a titanium oxide layer on the glass.

18. A process as claimed in claim 17, characterized in that the titanium oxide layer is deposited by sputtering of a titanium target in an atmosphere comprising an oxygen/argon mixture.

19. A process as claimed in claim 18, characterized in that, during performance or reactive high-frequency sputtering, the deposition power during deposition of the titanium oxide layer is in the range from 200 to 600 W.

20. A process as claimed in claim 18, characterized in that, during performance of reactive high-frequency sputtering, the deposition temperature during deposition of the titanium oxide layer is in the range from room temperature to 600° C.

21. A process as claimed in claim 11, furthermore comprising, after step a), deposition of a silicon oxynitride layer on the vanadium oxide layer.

22. A process as claimed in claim 21, characterized in that the silicon oxynitride layer is deposited by sputtering a silicon target in an atmosphere comprising an argon/oxygen/nitrogen mixture.

23. A process as claimed in claim 22, characterized in that, during performance of reactive high-frequency sputtering, the deposition power during deposition of the silicon oxynitride layer is in the range from 200 to 300 W.

24. A process as claimed in claim 22, characterized in that, during performance of reactive high-frequency sputtering, the deposition temperature during deposition of the silicon oxynitride layer is in the range from room temperature to 200° C.

25. A process for the production of a thermochromic coating on glass, comprising:
   a) deposition of a titanium oxide layer on a glass substrate, and
   b) deposition of a vanadium oxide layer doped with tungsten or fluorine, on the titanium oxide layer.

* * * * *